United States Patent [19]
Koyama et al.

[11] Patent Number: 5,680,149
[45] Date of Patent: Oct. 21, 1997

[54] DRIVING CIRCUIT FOR DRIVING LIQUID CRYSTAL DISPLAY DEVICE

[75] Inventors: Jun Koyama; Naomi Nakanishi, both of Kanagawa, Japan

[73] Assignee: Semiconductor Energy Laboratory Co., Ltd., Kanagawa-ken, Japan

[21] Appl. No.: 360,265

[22] Filed: Dec. 21, 1994

[30] Foreign Application Priority Data

Dec. 25, 1993 [JP] Japan ................... 5-347673

[51] Int. Cl.$^6$ ................... G09G 3/36
[52] U.S. Cl. ................... 345/98; 345/87
[58] Field of Search ................... 345/98, 92, 100, 345/204, 205, 87; 359/55, 57, 56, 58, 59

[56] References Cited

U.S. PATENT DOCUMENTS 5,376,926  12/1994  Sano ................... 345/98
5,455,534  10/1995  Motegi et al. ................... 345/98

*Primary Examiner*—Richard Hjerpe
*Assistant Examiner*—Regina Liang
*Attorney, Agent, or Firm*—Sixbey, Friedman, Leedom & Ferguson, P.C.; Gerald J. Ferguson, Jr.; Eric J. Robinson

[57] ABSTRACT

In a driving circuit for driving an active matrix type liquid crystal display device, the analog buffer includes a differential circuit constructed by P-channel thin film transistors (TFTs) and a current mirror circuit constructed by N-channel TFTs. When a voltage on a first input terminal of the differential circuit which is connected with a storage capacitor increases, an input current in the current mirror circuit connected with a reverse phase output terminal to the first input terminal decreases and an output current of the current mirror circuit decreases in response to decrease of the input current of the current mirror circuit. On the other hand, since a current through a common phase output terminal to the first input terminal increases, a voltage on the signal line increases and reaches a voltage on the first input terminal of the differential circuit.

27 Claims, 8 Drawing Sheets

DRIVING CIRCUIT FOR DRIVING LIQUID CRYSTAL DISPLAY DEVICE

BACKGROUND OF THE INVENTION

1. Field of the Invention

The present invention relates to a driving circuit for driving an active matrix type liquid crystal display device, in particular, a liquid crystal display device of an analog gradation display type.

2. Description of the Related Art

Figure 2:
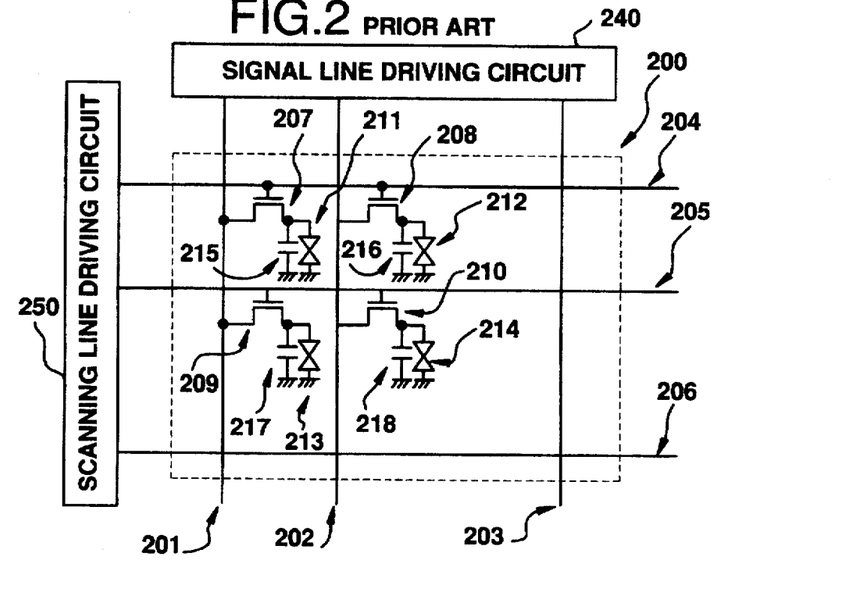
FIG. 2 shows an example of an active matrix type liquid crystal display device in which analog gradation lines are driven sequentially.

FIG. 2 shows an example of an active matrix type liquid crystal display device in which analog gradation lines are driven sequentially. The active matrix type liquid crystal display device includes a pixel matrix portion 200, a signal line driving circuit 240 and a scanning line driving circuit 250.

In the pixel matrix portion 200, signal lines 201 to 203 and scanning lines 204 to 206 are arranged at a matrix form. Pixel thin film transistors (TFTs) 207 to 210 are arranged in intersection portions of the signal lines and the scanning lines. In each of the TFTs 207 to 210, a gate, a source and a drain are connected with the scanning line, the signal line and a pixel electrode, respectively. In general, since a capacitance of liquid crystals 211 to 214 arranged between the pixel electrodes and opposite electrodes cannot have a large value, storage capacitors 215 to 218 for storing charges are arranged in vicinity of the pixel electrodes.

When a voltage higher than a threshold voltage of the TFT is applied to the scanning line and the TFT is turned on, the drain and the source in the TFT are in a short circuit state. When a voltage on the signal line is applied to the pixel electrode, the liquid crystal and the storage capacitor are charged. On the other hand, when the TFT is turned off, since the drain and the source is in an open circuit state, charges in the liquid crystal and the storage capacitor are stored until the TFT is turned on.

Figure 3:
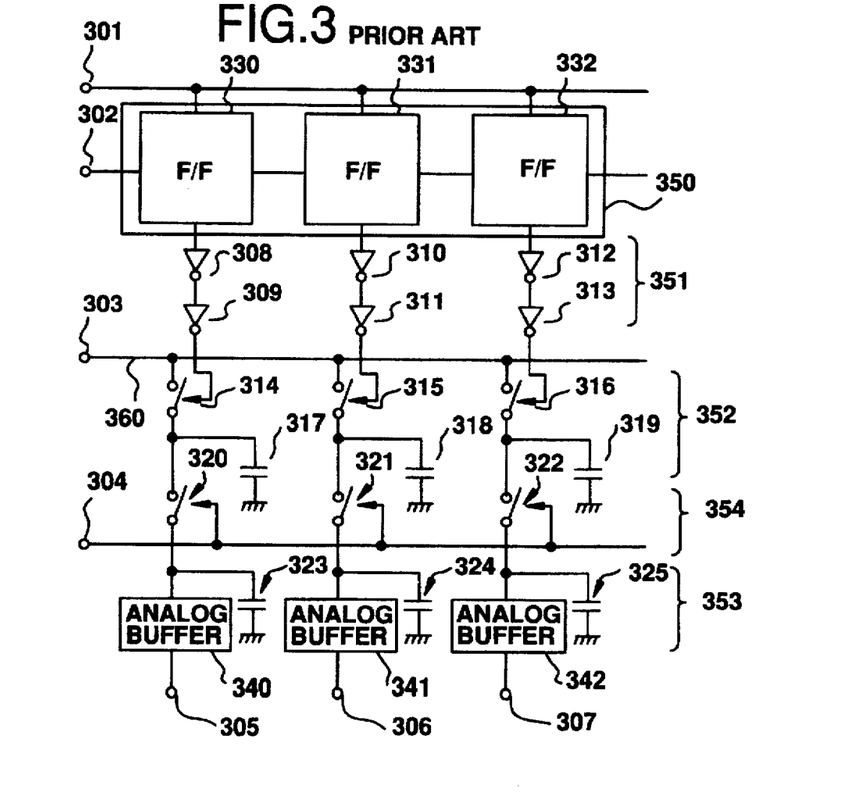
FIG. 3 shows an example of a signal line driving circuit.

FIG. 3 shows an example of the signal line driving circuit 240. The signal line driving circuit 240 includes a shift register circuit 350, a buffer circuit 351, a sampling circuit 352, a transfer circuit 354 and an analog buffer circuit 353. The shift register circuit 350 has flip-flops (F/Fs) 330 to 332. The buffer circuit 351 has invertor type buffers 308 to 313. The sampling circuit 352 has switches 314 to 316 and storage capacitors 317 to 319. The transfer circuit 354 has switches 320 to 322. The analog buffer circuit 353 has analog buffers 340 to 342 and storage capacitors 323 to 325.

In an analog gradation, a continuous video signal is used as a gradation signal input to the signal line driving circuit 240. When a liquid crystal is a normal white mode, it is set that a display portion of the liquid crystal display drive approaches black in accordance with increase of an absolute value of a voltage applied to the liquid crystal. The video signal is input from a video signal input terminal 303. A start pulse signal which synchronizes the video signal is input from a start pulse signal input terminal 302 to a flip-flop 330 of the shift register circuit 350, and then the shift register circuit 350 is shift-operated in response to a clock pulse signal input from a clock pulse signal input terminal 301. An output of the flip-flop 330 of the shift register circuit 350 is input to the switch 314 of the sampling circuit 352 through the buffers 308 and 309 of the buffer circuit 351.

Figure 4:
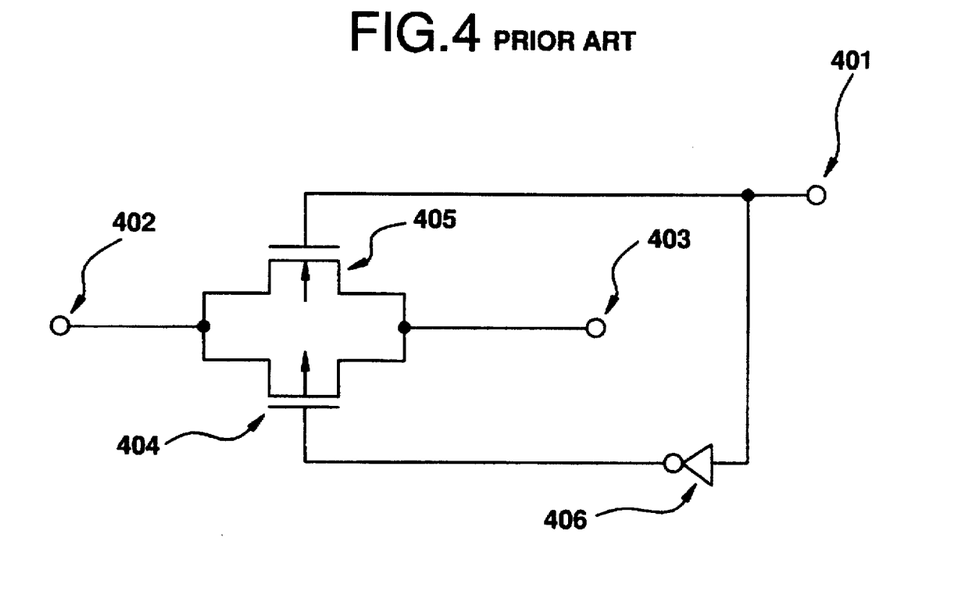
FIG. 4 shows an example of a transmission gate.

FIG. 4 shows an example of a transmission gate in which an N-channel TFT and a P-channel TFT are combined. The transmission gate includes a control terminal 401, an input terminal 402, an output terminal 403, an N-channel TFT 405 and a P-channel TFT 404. In FIG. 4, the input terminal 402 is electrically connected with the video signal line 360 and the output terminal 403 is electrically connected with the capacitor 317 or the like. Each of the switches 314 to 316 in the sampling circuit 352 is constructed by the transmission gate. The transmission gate is turned on/off by the buffer circuit 351 through the control terminal 401.

When the switch 314 is turned on, the video signal line 360 is electrically connected with the storage capacitors 317 to 319 of the sampling circuit 352 to store charges in the capacitors 317 to 319. When the start pulse signal passes through the flip-flop 330, an output of the flip-flop 330 is reversed, the switch 314 is turned off.

Since charges are stored in the storage capacitor 317, a voltage is stored until the switch 314 is turned on. After sampling of one line is completed, a transfer signal is input from a transfer signal input terminal 304 before next sampling is started. Therefore, the switches 320 to 322 of the transfer circuit 354 are turned on, the storage capacitors 317 to 319 are electrically connected with the storage capacitors 323 to 325 of the analog buffer circuit 353 to store a voltage in the capacitors 323 to 325.

When a capacitance value of the capacitors 323 to 325 is sufficiently smaller than that of the capacitors 317 to 319 and when the capacitors 317 to 319 and the capacitors 323 to 325 are in a short circuit state, change of the voltage is small. When the switches 320 to 322 are turned off, the voltage is stored in the storage capacitors 323 to 325.

The analog buffers 340 to 342 of the analog buffer circuit 353 are connected with the storage capacitors 323 to 325 to drive the signal lines through the analog buffers 340 to 342. The analog buffer circuit 353 is necessary to drive the signal lines without influencing the voltage of the storage capacitor.

Figure 5A:
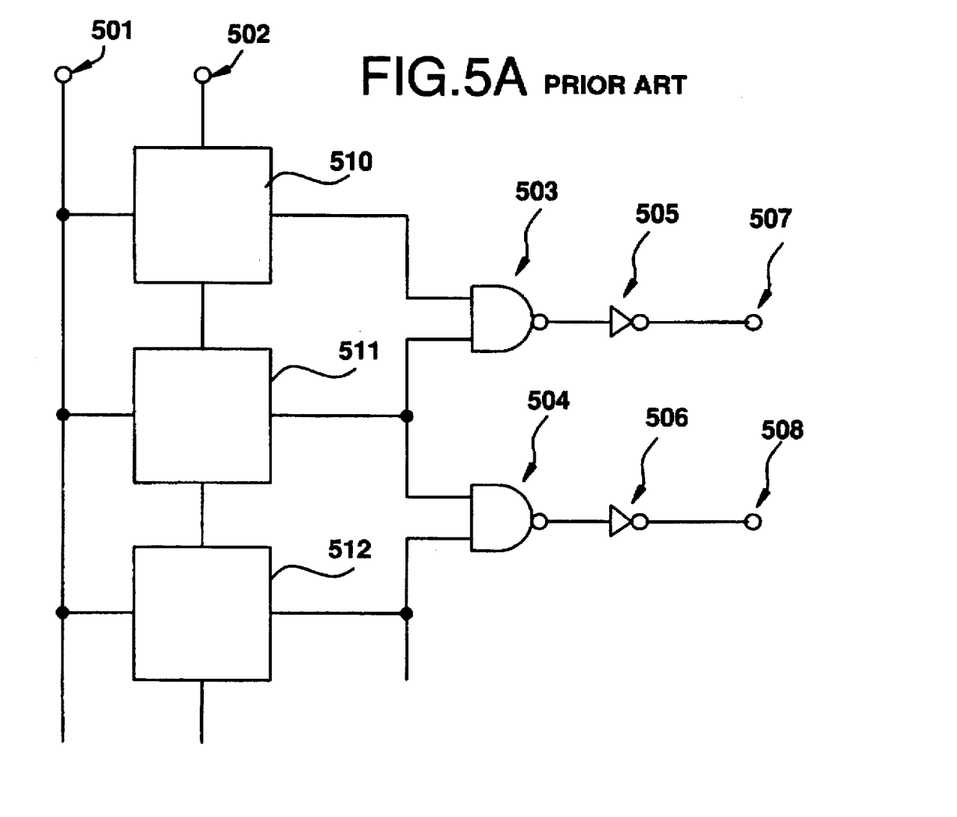
FIGS. 5A to 5C show an example of a scanning line driving circuit.
Figure 5B:
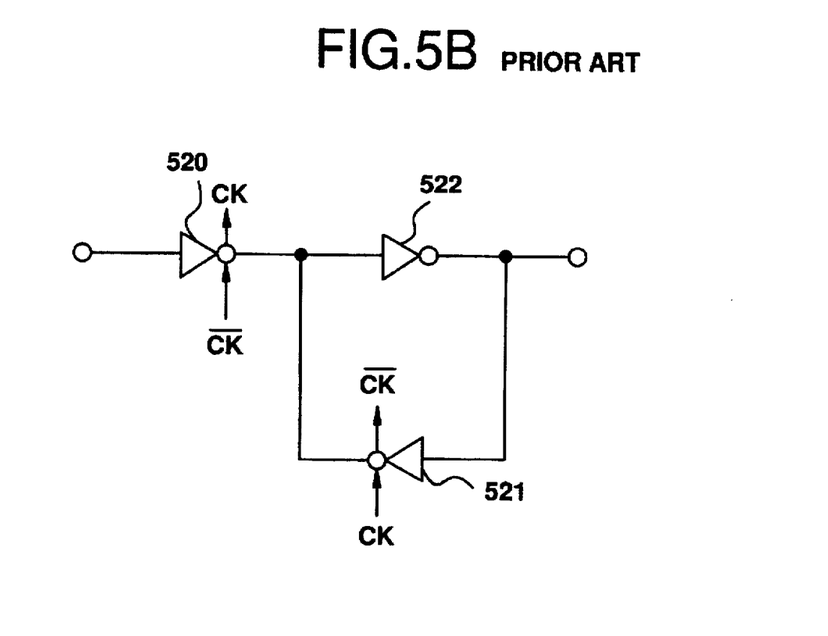
Figure 5C:
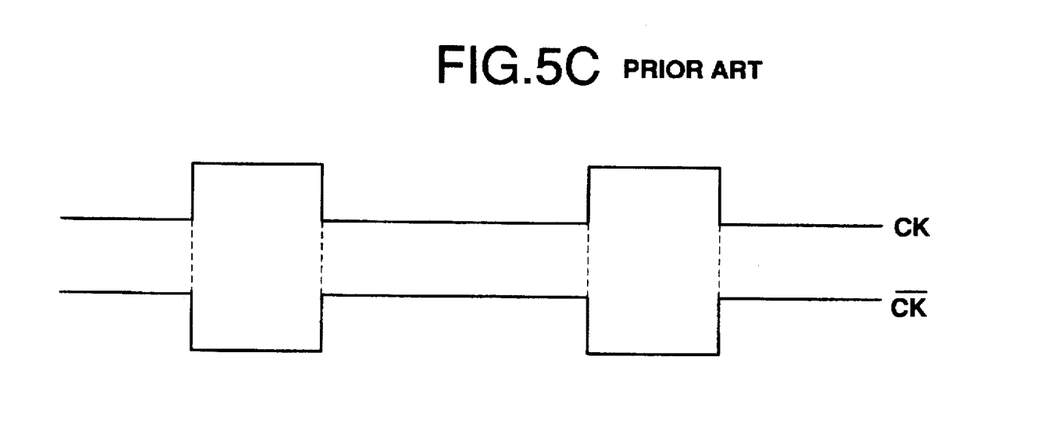

FIG. 5A shows an example of the scanning line driving circuit 250. The scanning line driving circuit 250 includes clocked invertor used circuits 510 to 512 (as shown in FIG. 5B), NAND circuits 503 and 504 and invertor type buffers 505 and 506. The clocked invertor used circuit includes clocked invertors 520 and 521 operated by a clock signal CK (as shown in FIG. 5C) and an invertor 522. The start pulse signal which synchronizes a vertical synchronizing signal is input from a start pulse signal input terminal 502, and the clock pulse signal which synchronizes a horizontal synchronizing signal is input from a clock pulse signal input terminal 501. Therefore, the scanning lines are driven sequentially through scanning line connection terminals 507 and 508.

In a conventional driving circuit for a liquid crystal display device, there are the following problems. In an analog buffer arranged in a terminal portion of the signal line driving circuit, it is necessary to drive the signal line without influencing the voltage of the storage capacitor and to apply its voltage to the signal line. However, since a source follower circuit constructed at one state or two states is arranged in the conventional analog buffer, a difference of the voltage between the storage capacitor and the signal line produces.

Figure 6A:
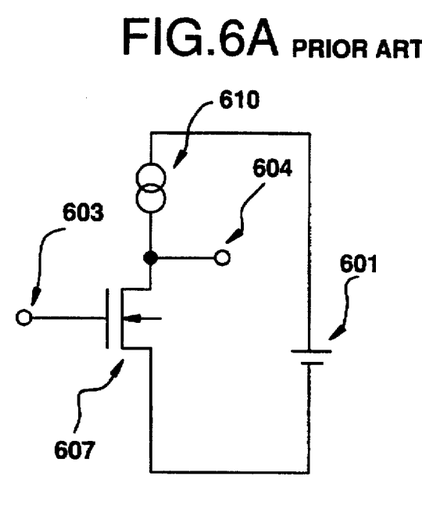
FIGS. 6A and 6B and FIG. 7 show examples of an analog buffer using a souse follower circuit.
Figure 6B:
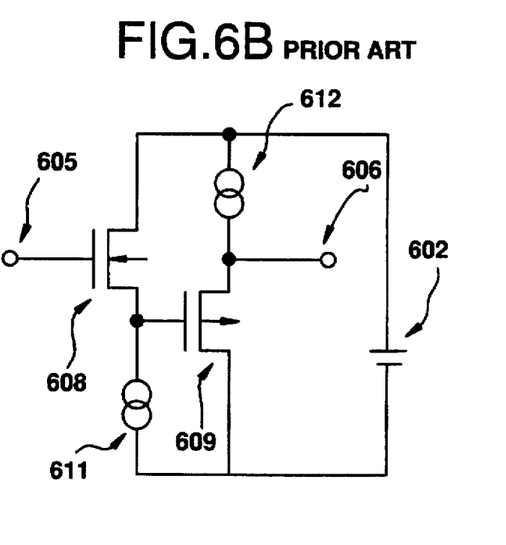

FIGS. 6A and 6B show examples of an analog buffer using a source follower circuit. In FIG. 6A, the analog buffer includes a voltage source 601, storage capacitor connection terminal 603, a signal line connection terminal 604, an N-channel TFT 607 and a constant current source 610. Also, in FIG. 6B, the analog buffer includes a voltage source 602, storage capacitor connection terminal 605, a signal line connection terminal 606, an N-channel TFT 608, a P-channel TFT 609 and constant current sources 611 and 612.

When a source follower circuit constructed at one stage is used in the analog buffer, since it is required that a voltage between a gate and a source in a TFT exceed a threshold voltage of the TFT, a difference of the voltage between the storage capacitor and the signal line is large. Also, when a source follower circuit is constructed at two stages and an N-channel TFT are combined with a P-channel TFT to decrease a difference of the voltage due to the threshold voltage, since the threshold voltage of the N-channel TFT does not always coincide with that of the P-channel TFT, a difference of the voltage produces.

Figure 7:
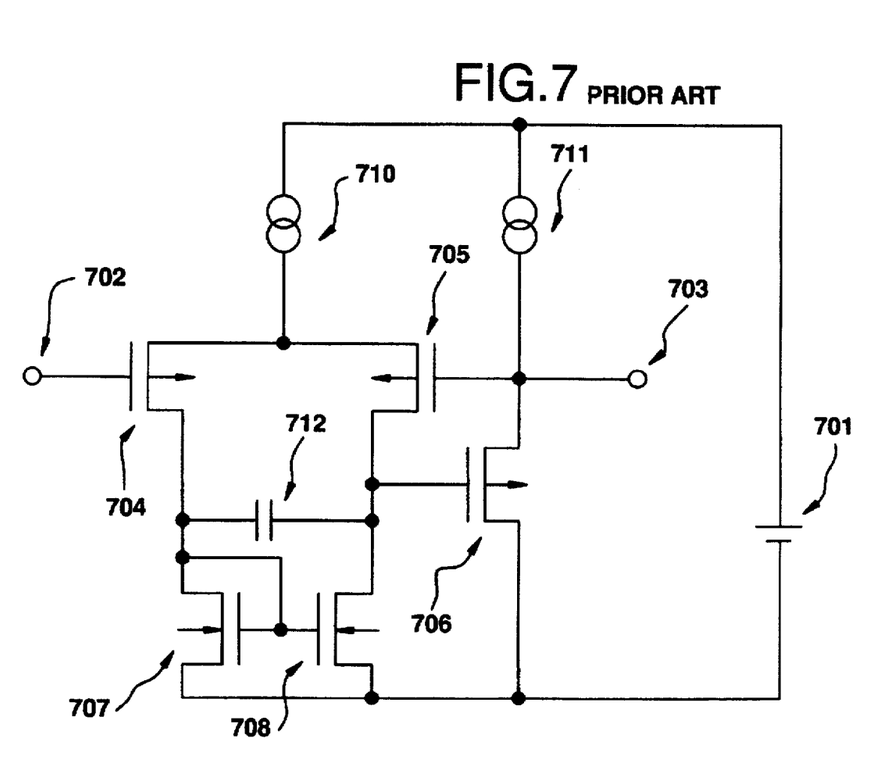

When only source follower circuit is not used, an analog buffer is constructed by a source follower circuit and a differential circuit, as shown in FIG. 7. In FIG. 7, the analog buffer includes a voltage source 701, a storage capacitor connection terminal 702, a signal line connection terminal 703, P-channel TFTs 704 to 706, N-channel TFTs 707 and 708, constant current sources 710 and 711, and an oscillation preventing capacitor 712. When such analog buffer is used, since the storage capacitor is connected with the signal line through the TFTs each having the same polarity (same conductivity type), influence due to the threshold voltage is canceled, a voltage of the storage capacitor almost coincides with that of the signal line and there is no problem with respect to a difference of voltage. However, when a capacitive load such as the signal line is connected with the differential circuit, phase loop in the source follower circuit is large and therefore oscillation occurs easily.

Figure 8:
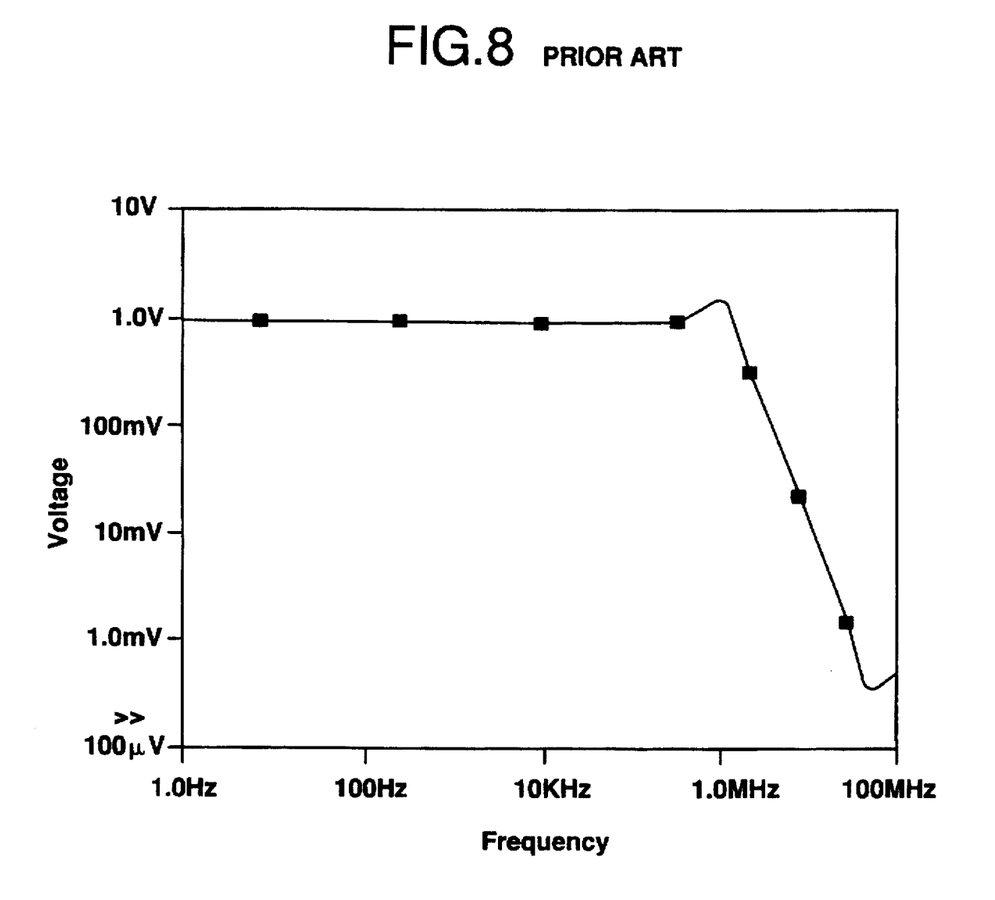
FIG. 8 shows a frequency characteristic in the analog buffer which a capacitive load is connected with, as shown in FIG. 7.

FIG. 8 shows a frequency characteristic of a circuit which a capacitive load is connected with the analog buffer as shown in FIG. 7. From FIG. 8, a peaking representing an unstable state produces. In order to prevent oscillation, it is necessary to arrange the oscillation preventing capacitor 712 having several pF to several ten pF in the analog buffer. However, when such capacitor is used, a large area is required in manufacturing an integrated circuit.

SUMMARY OF THE INVENTION

An object of the present invention is to solve the above problems. In the present invention, an analog buffer includes a differential circuit constructed by TFTs each having the same polarity (same conductivity type) and a current mirror circuit constructed by TFTs having another polarity different from the polarity, an output terminal of the current mirror circuit is directly connected with the signal lines. Therefore, the analog buffer without using a source follower circuit is constructed.

According to the present invention, there is provided a driving circuit for driving a signal line in a liquid crystal display device, the driving circuit comprising: a storage circuit for storing a voltage to be supplied to the signal line; a differential circuit which is constructed by thin film transistors each having a first polarity and has a first input terminal connected with the storage circuit, a second input terminal connected with the signal line, a first output terminal phase-reversed to the first input terminal, and a second output terminal phase-coincided with the first input terminal; and a current mirror circuit which is constructed by another thin film transistors each having a second polarity different from the first polarity and has an input terminal connected with the first output terminal and an output terminal connected with the second input terminal and the second output terminal.

DETAILED DESCRIPTION OF THE PREFERRED EMBODIMENTS

Figure 1:
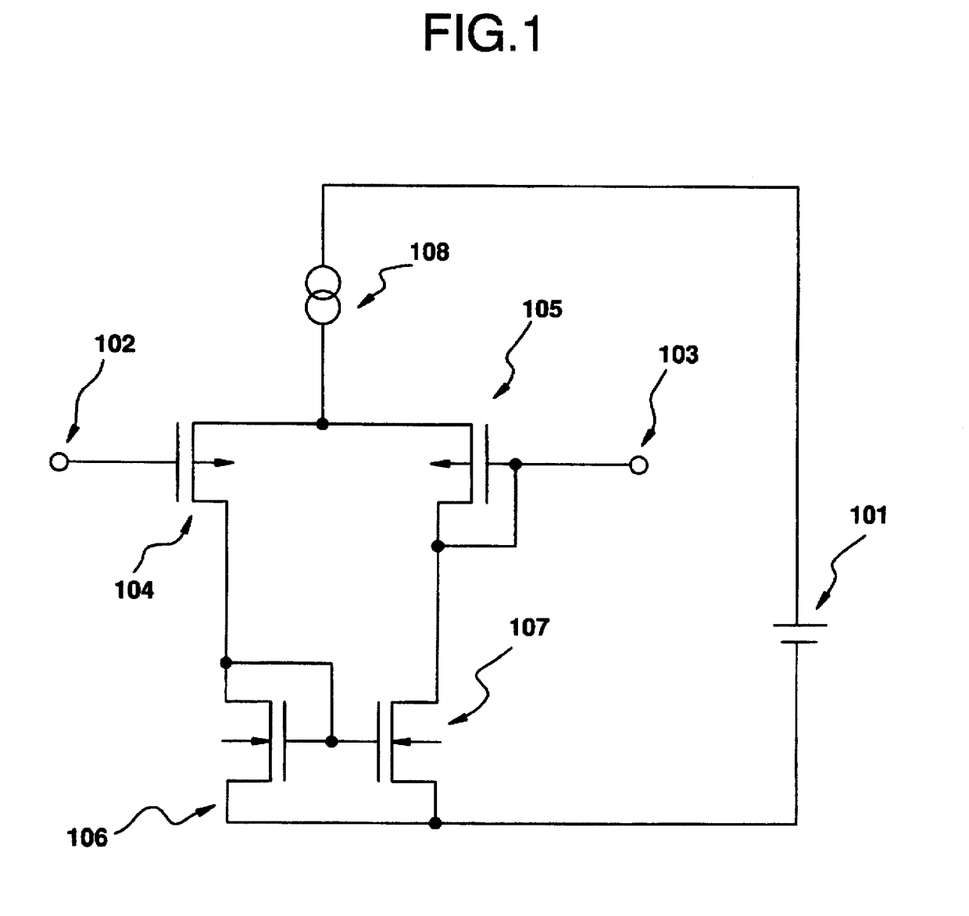
FIG. 1 shows an analog buffer according to an embodiment of the present invention.

In an analog buffer according to the embodiment of the present invention, a differential circuit is constructed by P-channel type thin film transistors (TFTs) and a current mirror circuit is constructed by N-channel type TFTs. When a voltage in a first input terminal of the differential circuit connected with a storage capacitor increases, the current through TFT 104 decreases and an input current of the current mirror circuit which is connected with an output terminal having a reverse phase with respect to the first input terminal decreases and an output current of the current mirror circuit decreases in response to decrease of the input current of the current mirror circuit. Since the p-channel TFTs 104 and 105 are connected with a constant source current source 108, current applied to TFT 105 will increase as a result of the decrease in current through TFT 104. Thus, since a current through output terminal having a common phase with respect to the first input terminal increases, a voltage on the signal line increases and reaches a voltage on the first input terminal of the differential circuit. In a case wherein the differential circuit is constructed by N-channel type TFTs and the current mirror circuit is constructed by P-channel type TFTs, the same operation can be performed.

FIG. 1 shows an analog buffer according to an embodiment of the present invention. The analog buffer of the embodiment is constructed by a differential circuit and a current mirror circuit and includes a voltage source 101, a storage capacitor connection terminal 102, a signal line connection terminal 103, P-channel TFTs 104 and 105, N-channel TFTs 106 and 107, and a constant current source 108.

In the differential circuit, sources of the P-channel TFTs 104 and 105 are connected with the constant current source 108. The storage capacitor connection terminal 102 is connected with a gate of the TFT 104. The signal line connection terminal 103 is connected with a gate of the TFT 105.

The current mirror circuit is constructed by the N-channel TFTs 106 and 107. A gate and a drain of the TFT 106 are connected with a gate of the TFT 107 to use as an input terminal. A drain of the TFT 107 is used as an output terminal and connected with the signal line connection terminal 103 and the drain of the TFT 105.

Figure 9:
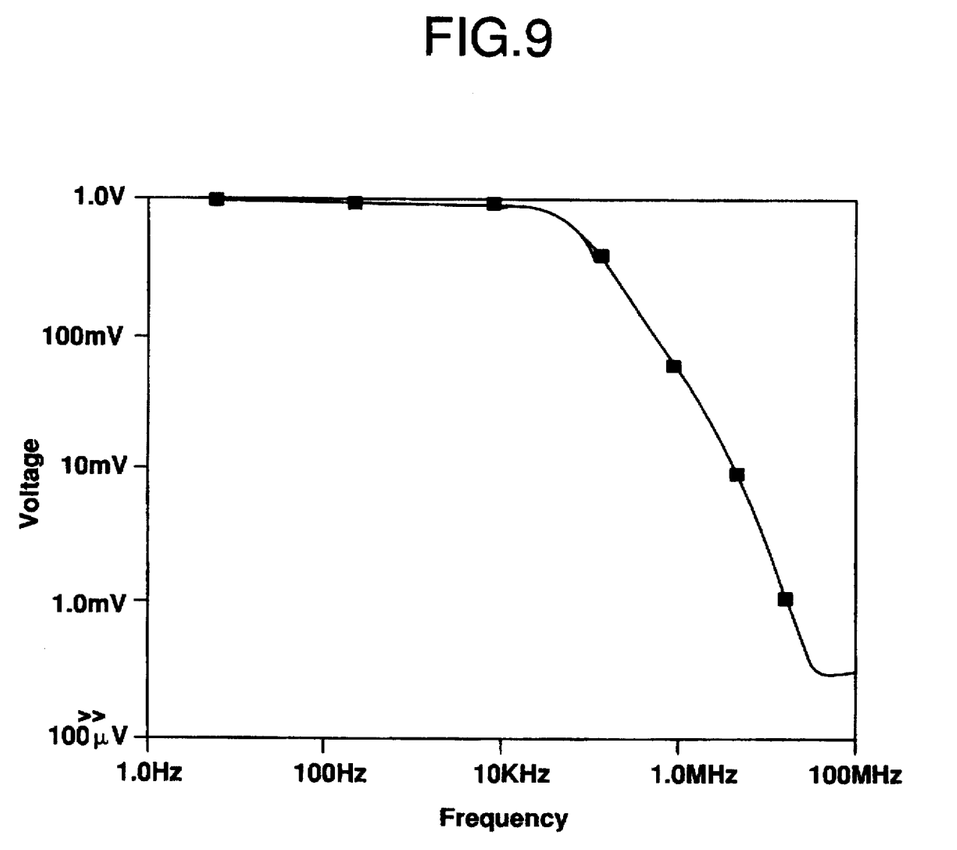
FIG. 9 shows a frequency characteristic in the analog buffer as shown in FIG. 1.

In the present invention, since threshold voltages of the N-channel type TFTs 106 and 107 are canceled, a difference of the voltage between the storage capacitor connection terminal 102 and the signal line connection terminal 103 gets sufficiently small. Also, since a source follower circuit is not used in the embodiment, stability in the analog buffer is improved and a peaking is not produced in a frequency characteristic as shown in FIG. 9.

Figure 10:
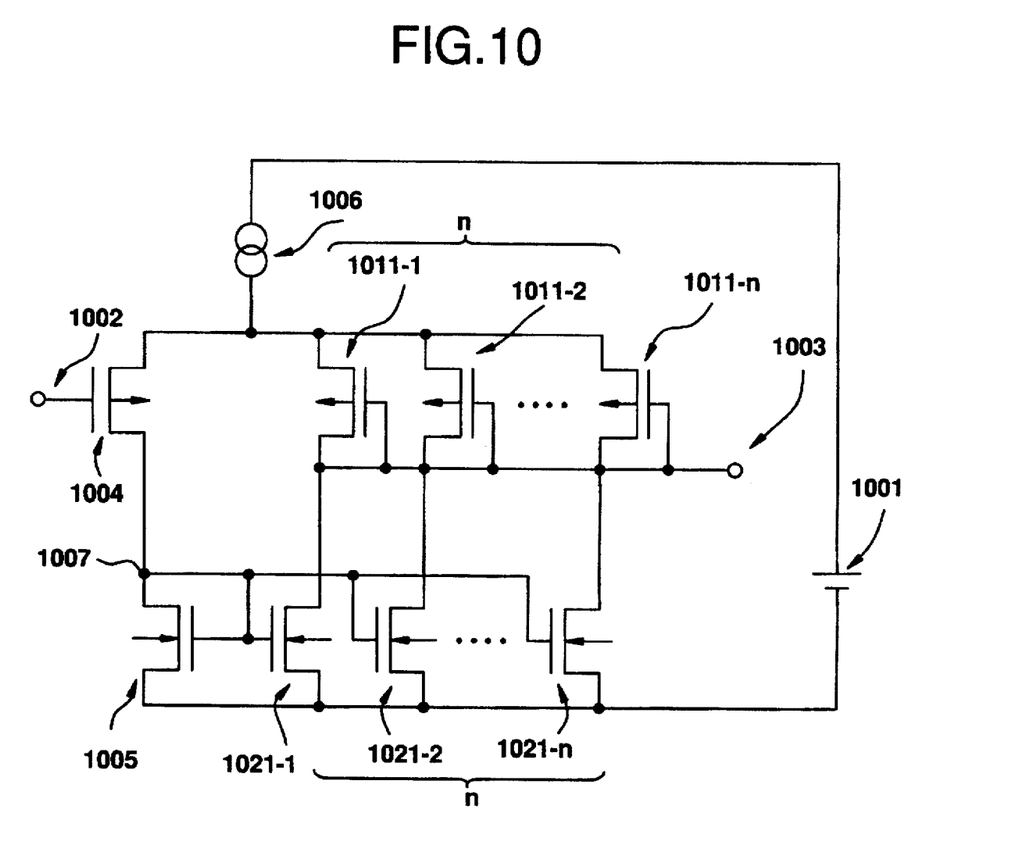
FIG. 10 shows an analog buffer according to another embodiment of the present invention.

FIG. 10 shows an analog buffer constructed by a differential circuit and a current mirror circuit, according to another embodiment of the present invention. In FIG. 10, the analog buffer includes a voltage source 1001, a storage capacitor connection terminal 1002, a signal line connection terminal 1003, P-channel TFTs 1004, 1011-1, 1011-2, . . . , 1011-n, N-channel TFTs 1005, 1021-1, 1021-2, . . . , 1021-n, and a constant current source 1006.

In the analog buffer, the number of TFTs used in second input and an output side (signal line connection terminal portion) of the differential circuit and the current mirror circuit are increased n-times in comparison with the analog buffer of FIG. 1, to improve current capacity. When a voltage of the storage capacitor connection terminal 1002 decreases, a current from the constant current source 1006 almost flows into the TFT 1004 and further flows into an input terminal 1007 of the current mirror circuit. Since the number of TFTs in the output side of the current mirror circuit is n-times in comparison with an input side of the current mirror circuit, it is possible to obtain n-times the current output from the constant current source 1006 from the signal line connection terminal 1003 and to driven the signal line at high speed.

When the voltage on the storage capacitor connection terminal 1002 almost coincides with that on the signal line connection terminal 1003, the current output from the constant current source 1006 flows into each of the P-channel TFTs. Since a current input/output ratio of the P-channel TFTs in the differential circuit is 1:n and a current input/output ratio of the N-channel TFTs in the current mirror circuit is also 1:n, an input voltage on the storage capacitor connection terminal and an output voltage on the signal line connection terminal are independent on the number of TFTs.

In the embodiment, although a current input/output ratio is changed in accordance with the number of TFTs, a width and a length of a gate in the TFT may be changed, or a resister may be arranged in a source in one TFT.

In the present invention, Since an analog buffer is constructed without using a source follower circuit, a difference between the input voltage and the output voltage is small and it is not required to use a capacitor for preventing oscillation and to provide a large area in manufacturing.

What is claimed is:

1. A driving circuit for driving a signal line in a liquid crystal display device, the driving circuit comprising:
   storage means for storing a voltage to be supplied to the signal line;
   a differential circuit which is constructed by thin film transistors each having a first polarity and has a first input terminal connected with the storage means, a second input terminal connected with the signal line, a first output terminal phase-reversed to the first input terminal, and a second output terminal phase-coincided with the first input terminal; and
   a current mirror circuit which is constructed by another thin film transistors each having a second polarity different from the first polarity and has an input terminal connected with the first output terminal and an output terminal directly connected with the second input terminal and the second output terminal.

2. The circuit of claim 1 wherein an output current value of the current mirror circuit is larger than an input current value of the current mirror circuit.

3. The circuit of claim 1 wherein the first polarity and the second polarity represent a first conductivity type and a second conductivity type, respectively.

4. The circuit of claim 1 wherein the storage means includes a capacitor.

5. The circuit of claim 1 wherein when a voltage on the first input terminal coincides with that on the second input terminal, a ratio of an output current from the first output terminal and an output current from the second output terminal coincides with that of an input current from the input terminal and an output current from the output terminal.

6. A driving circuit for driving an active matrix circuit having signal lines in a liquid crystal display device, the driving circuit comprising:
   storage means for storing a voltage to be supplied to the signal line;
   a differential circuit constructed by thin film transistors having a first input terminal connected with the storage means, a second input terminal connected with the signal line, a first output terminal, and a second output terminal; and
   a current mirror circuit constructed by another thin film transistors having an input terminal connected with the first output terminal and an output terminal directly connected with the second input terminal and the second output terminal.

7. The circuit of claim 6 wherein the storage means includes a capacitor.

8. The circuit of claim 6 wherein the thin film transistors constructing the differential circuit each has an N-channel type and the another thin film transistors constructing the current mirror circuit each has a P-channel type.

9. The circuit of claim 6 wherein the thin film transistors constructing the differential circuit each has a P-channel type and the another thin film transistors constructing the current mirror circuit each has an N-channel type.

10. The circuit of claim 6 wherein the first output terminal is phase-reversed to the first input terminal and the second output terminal is phase-coincided with the second input terminal.

11. A liquid crystal display device comprising:
   an active matrix circuit having a plurality of signal lines; and
   a plurality of driving means for driving the signal lines, wherein each of the driving means comprises,
      storage means for storing a voltage to be supplied to one of the signal lines;
      a differential circuit constructed by thin film transistors having a first input terminal connected with the storage means,
      a second input terminal connected with the signal line, a first output terminal, and a second output terminal; and
      a current mirror circuit constructed by another thin film transistors having an input terminal connected with the first output terminal and an output terminal directly connected with the second input terminal and the second output terminal.

12. The device of claim 11 wherein the storage means includes a capacitor.

13. The device of claim 11 wherein the thin film transistors constructing the differential circuit each has an N-channel type and the another thin film transistors constructing the current mirror circuit each has a P-channel type.

14. The device of claim 11 wherein the thin film transistors constructing the differential circuit each has a P-channel type and the another thin film transistors constructing the current mirror circuit each has an N-channel type.

15. The device of claim 11 wherein the first output terminal is phase-reversed to the first input terminal and the second output terminal is phase-coincided with the second input terminal.

16. The device of claim 11 wherein the liquid crystal display device has an analog gradation display type.

17. An analog buffer for a driving circuit for driving an active matrix circuit having signal lines in a liquid crystal display device, the analog buffer comprising:

a differential circuit constructed by thin film transistors having a first input terminal connected with a capacitor for storing a voltage to be supplied to the signal line, a second input terminal connected with the signal line, a first output terminal, and a second output terminal; and a current mirror circuit constructed by another thin film transistors having an input terminal connected with the first output terminal and an output terminal directly connected with the second input terminal and the second output terminal.

18. The circuit of claim 17 wherein the storage means includes a capacitor.

19. The circuit of claim 17 wherein the thin film transistors constructing the differential circuit each has an N-channel type and the another thin film transistors constructing the current mirror circuit each has a P-channel type.

20. The circuit of claim 17 wherein the thin film transistors constructing the differential circuit each has a P-channel type and the another thin film transistors constructing the current mirror circuit each has an N-channel type.

21. The circuit of claim 17 wherein the first output terminal is phase-reversed to the first input terminal and the second output terminal is phase-coincided with the second input terminal.

22. A liquid crystal display device comprising:

an active matrix circuit having signal lines and scanning lines;

first driving means for driving the scanning lines; and a plurality of second driving means for driving the signal lines, wherein each of the second driving means includes,
supplying means for supplying a voltage to one of the signal lines, and
a buffer arranged between the supplying means and the one signal line, wherein the buffer includes,
a differential circuit constructed by thin film transistors having a first input terminal connected with the supplying means, a second input terminal connected with the one signal line, a first output terminal, and a second output terminal, and
a current mirror circuit constructed by another thin film transistors having an input terminal connected with the first output terminal and an output terminal directly connected with the second input terminal and the second output terminal.

23. The device of claim 22 wherein the supplying means includes a capacitor.

24. The device of claim 22 wherein the thin film transistors constructing the differential circuit each has an N-channel type and the another thin film transistors constructing the current mirror circuit each has a P-channel type.

25. The device of claim 22 wherein the thin film transistors constructing the differential circuit each has a P-channel type and the another thin film transistors constructing the current mirror circuit each has an N-channel type.

26. The device of claim 22 wherein the first output terminal is phase-reversed to the first input terminal and the second output terminal is phase-coincided with the second input terminal.

27. The device of claim 22 wherein the liquid crystal display device has an analog gradation display type.

* * * * *